(12) United States Patent
Zhang et al.

(10) Patent No.: US 10,547,129 B2
(45) Date of Patent: Jan. 28, 2020

(54) ELECTRICAL CONTACT HAVING BULGED RETENTION SECTION WITH A PLURALITY OF THROUGH HOLES THEREIN

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Yun Zhang, Kunshan (CN); Xue-Yuan Xiao, Kunshan (CN); Zi-Qiang Zhu, Kunshan (CN)

(73) Assignees: FOXCONN (KUNSHAN) COMPUTER CONNECTOR C, Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/296,242

(22) Filed: Mar. 8, 2019

(65) Prior Publication Data

US 2019/0280406 A1    Sep. 12, 2019

(30) Foreign Application Priority Data

Mar. 8, 2018 (CN) .................... 2018 2 0317125 U

(51) Int. Cl.
*H01R 12/00* (2006.01)
*H01R 12/58* (2011.01)
*H05K 1/11* (2006.01)
*H05K 1/18* (2006.01)

(52) U.S. Cl.
CPC .......... *H01R 12/585* (2013.01); *H05K 1/115* (2013.01); *H05K 1/182* (2013.01)

(58) Field of Classification Search
CPC ...... H01R 12/58; H01R 12/585; H05K 1/115; H05K 1/182
USPC ................................................ 439/55, 78–82
See application file for complete search history.

(56) References Cited

U.S. PATENT DOCUMENTS

| 4,836,806 | A | | 6/1989 | Dougherty | |
| 4,936,797 | A | * | 6/1990 | Wehrle | H01R 12/58 439/751 |
| 6,280,248 | B1 | * | 8/2001 | Mitra | H01R 12/7064 439/571 |
| 6,974,329 | B2 | * | 12/2005 | Henneberg | H01R 12/585 439/59 |
| 10,236,603 | B2 | * | 3/2019 | Goto | H01B 5/02 |

FOREIGN PATENT DOCUMENTS

CN            2618322 Y         5/2004

* cited by examiner

*Primary Examiner* — Khiem M Nguyen
(74) *Attorney, Agent, or Firm* — Wei Te Chung; Ming Chieh Chang

(57) ABSTRACT

An electrical contact includes a compliant tail defining a pair of opposite first main face and second main face, and a pair of opposite first side face and second side face linked between the first main face and the second main face. The opposite first side face and second side face are bulged for engagement with an interior surface of the corresponding through hole. A pair of first through holes and a pair of second through holes extend through both the first main face and the second main face. The first through holes are configured with an elongated configuration while the second though holes are located around two opposite upper and lower ends of the first through holes.

20 Claims, 7 Drawing Sheets

ELECTRICAL CONTACT HAVING BULGED RETENTION SECTION WITH A PLURALITY OF THROUGH HOLES THEREIN

BACKGROUND OF THE INVENTION

1. Field of the Invention

The present invention relates generally to an electrical contact for mounting within a through hole of a printed circuit board, and more particularly to the contact having a bulged retention section with a plurality of through holes therein.

2. Description of Related Arts

The electrical contact for mounting into a through hole of a printed circuit board, essentially has a compliant or press-fit tail extending through the through hole wherein such a compliant or press-fit tail has a bulged retention section with a fish-eye like through hole therein typically. Anyhow, a variety of hole arrangements on the bulged retention section are used for achieving the desired retention function while some of which require relatively complicate manufacturing method disadvantageously.

An electrical contact having a compliant or press-fit tail with superior retention function while being structured via the relatively simple manufacturing way, is desired.

SUMMARY OF THE INVENTION

An object of the present invention is to provide an electrical contact for mounting through a through hole of a printed circuit board wherein such a contact is simply made via stamping to extend in a plane.

To achieve the above-mentioned object, an electrical contact includes a compliant tail defining a pair of opposite first main face and second main face, and a pair of opposite first side face and second side face linked between the first main face and the second main face. The opposite first side face and second side face are bulged for engagement with an interior surface of the corresponding through hole. A pair of first through holes and a pair of second through holes extend through both the first main face and the second main face. The first through holes are configured with an elongated configuration while the second though holes are located around two opposite upper and lower ends of the first through holes.

DETAILED DESCRIPTION OF THE PREFERRED EMBODIMENT

Figure 1:
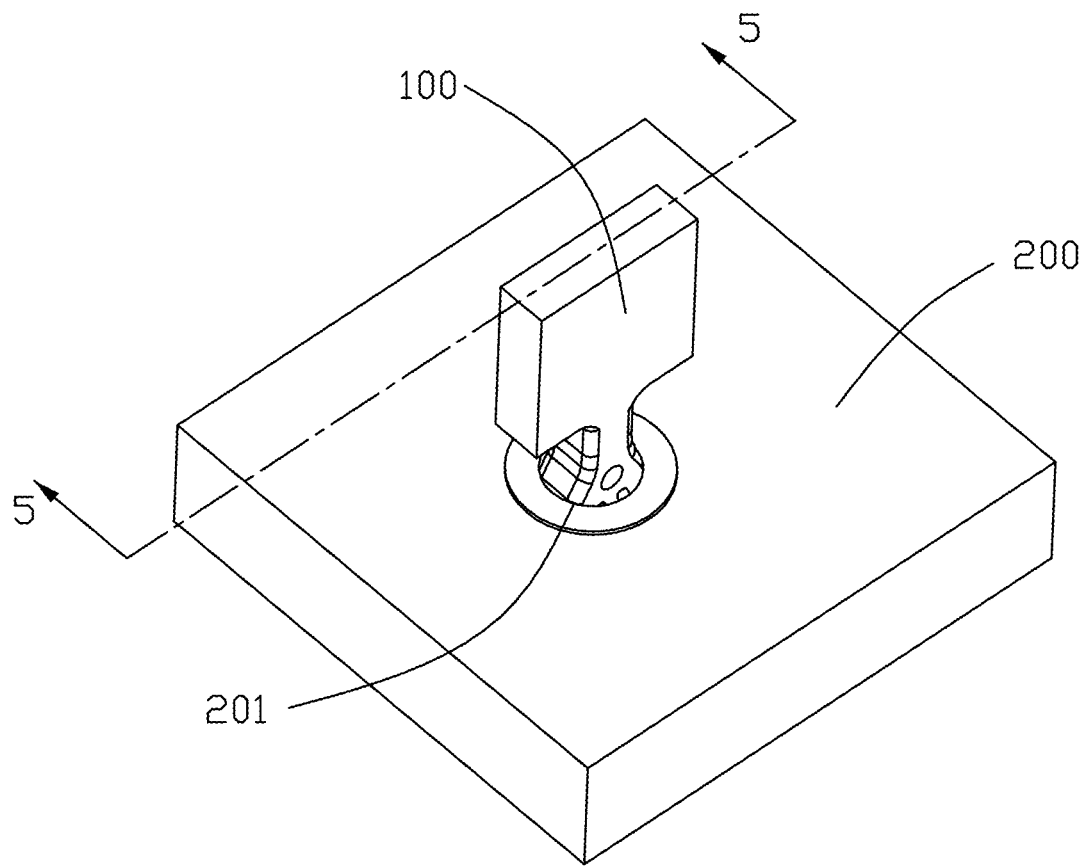
FIG. 1 is a top perspective view of an electrical contact assembled to a printed circuit board according to a first embodiment of the invention.
Figure 2:
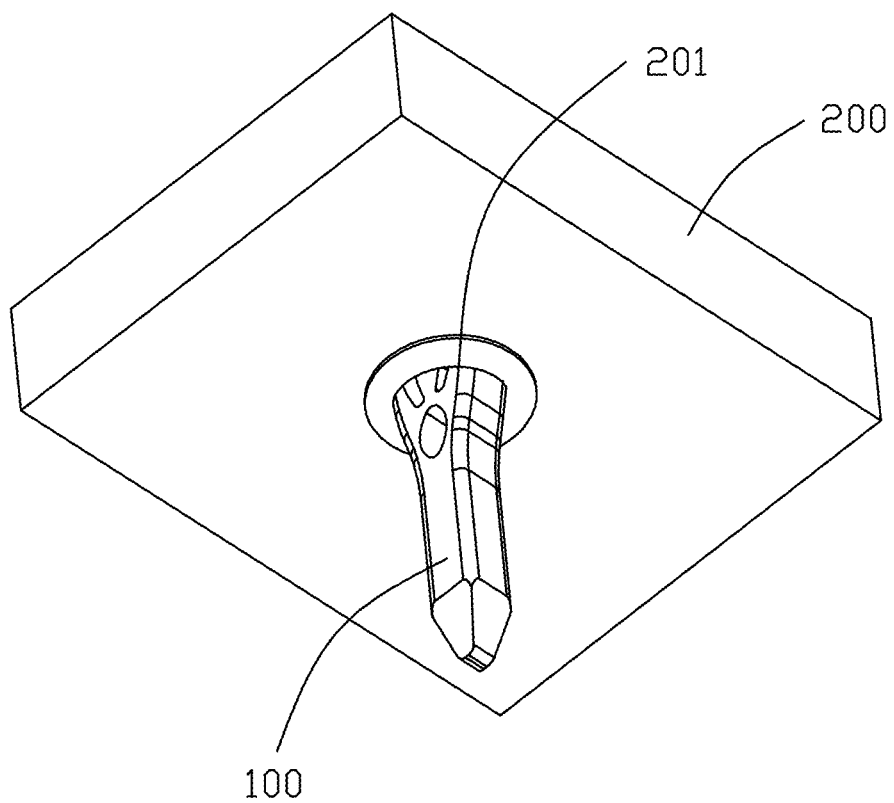
FIG. 2 is a bottom perspective view of the assembled electrical contact and printed circuit board of FIG. 1.
Figure 3:
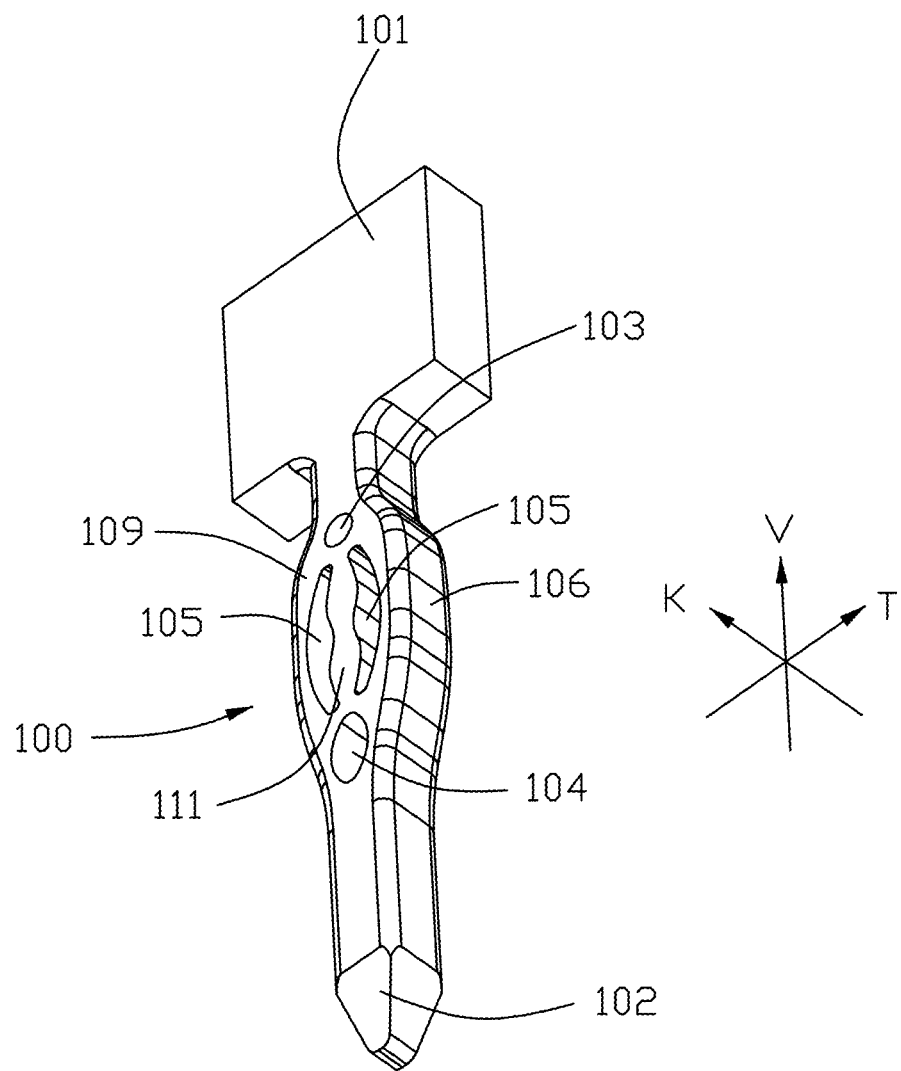
FIG. 3 is a perspective view of the electrical contact of FIG. 1.
Figure 4:
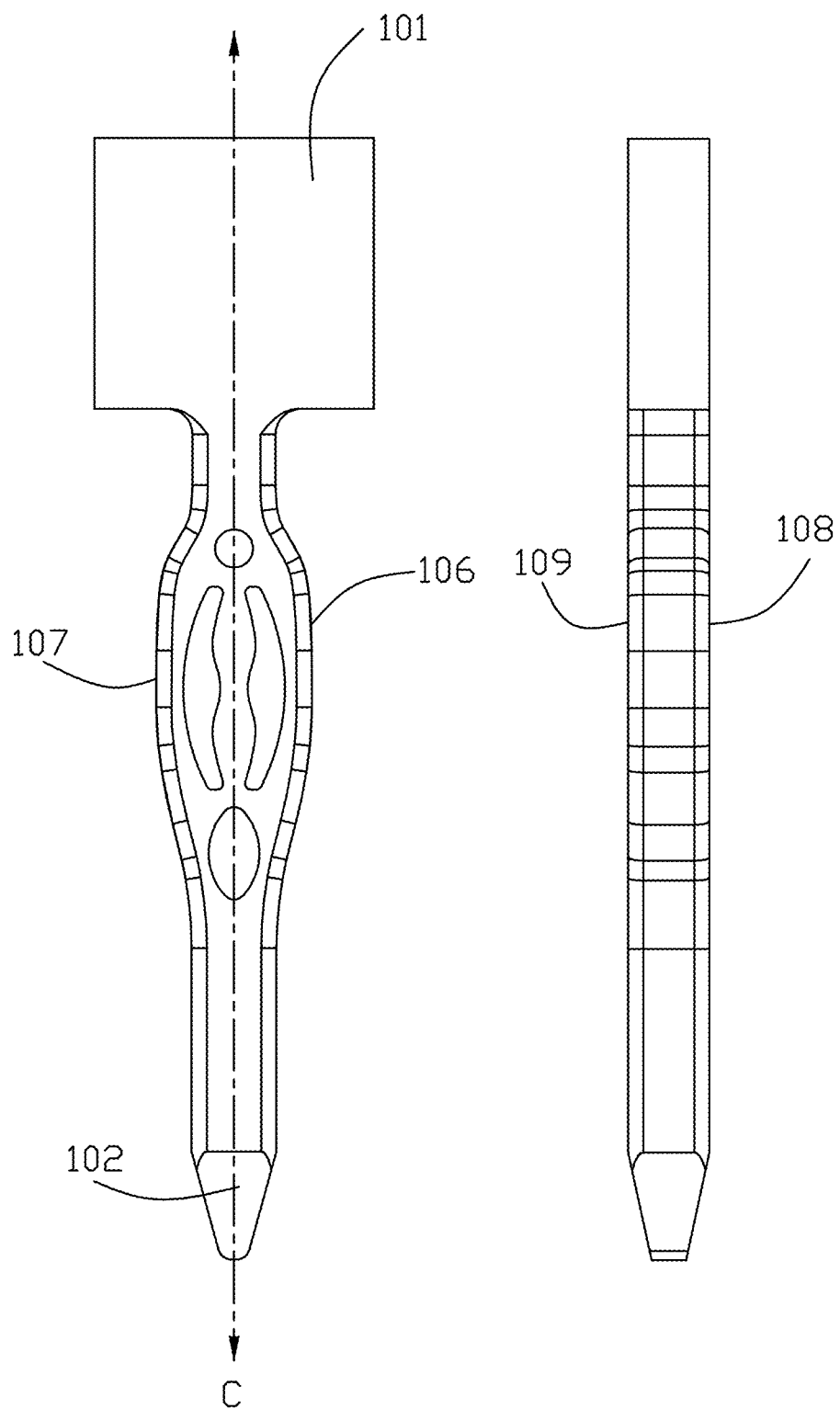
FIG. 4 is elevantional views of the electrical contact of FIG. 3.

Referring to FIGS. 1-5, an electrical contact stamped from shell metal, includes a compliant tail 100 for mounting into a through/positioning hole 201 of a printed circuit board 200. The contact includes a head 101 extending upwardly from the compliant tail 100, and a free end 102 located at the bottom of the compliant tail 100. The compliant tail 100 includes a pair of opposite first main face 108 and second main face 109, and a pair of opposite first side face 106 and second side face 107 linked between the pair of first main face 108 and second main face 109 wherein the first side face 106 and the second side face 107 are bulged for elastically pressing an interior surface of the positioning hole 201. In other words, the maximum width of the compliant leg 100 around the bulged area. i.e., the retention section, is slightly larger than a diameter of the positioning hole 201.

A pair of first holes 105 and a pair of second holes 103/104 extend through the complaint leg 100 in the thickness direction K. The pair of first holes 105 are located on two sides of the bulged area in the transverse direction T perpendicular to the thickness direction K, and extending in the vertical/top-to-bottom direction V perpendicular to both the thickness direction K and the transverse direction T. In other words, the pair of first holes 105 are symmetrical with each other with regard to the centerline C of the compliant tail 100 which extends in the vertical direction V. Notably, the pair of first holes 105 are configured to be inwardly bowed like of a partial moon toward each other. Specifically, in the compliant tail 100 the rib or divider 111 formed between the pair of first holes 105 in the transverse direction T and extending along the centerline C, forms a calabash configuration so as to counterbalance the contour of the bulged area when the bulged area is inwardly pressed in the positioning hole 201.

Figure 5:
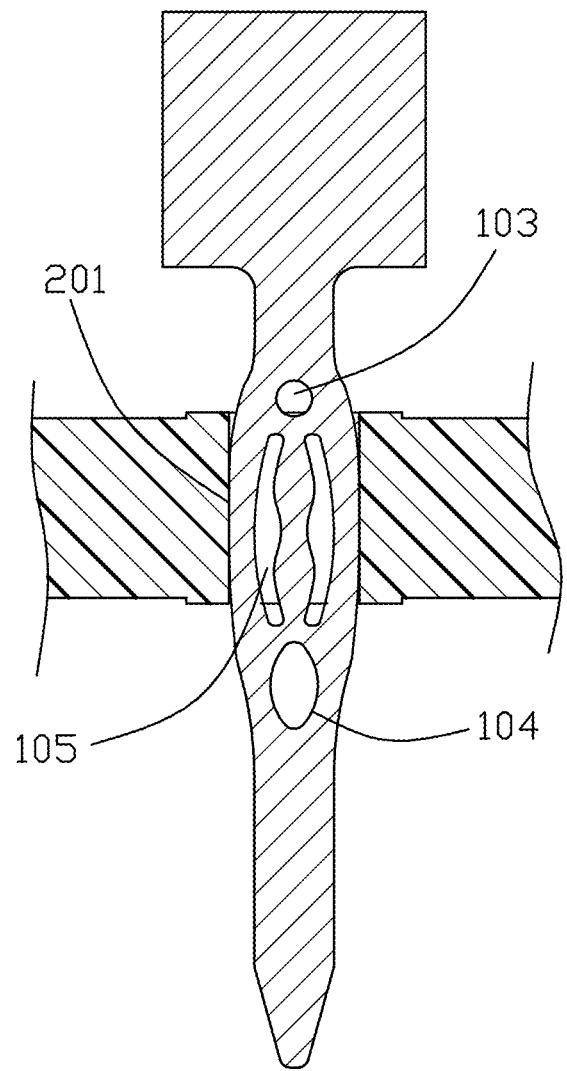
FIG. 5 is across-sectional view of the assembled electrical contact in the printed circuit board of FIG. 1.

The pair of second holes 103/104 are respectively located around the top ends and the bottom ends of the pair of first holes 105 in the vertical direction V. The elliptical second hole 104 is larger than the round second hole 103. As shown in FIG. 5, during mounting to the printed circuit board 200, the pair of second holes 103/104 are exposed outside of the positioning hole 201 and respectively above the top surface and below the bottom surface of the printed circuit board 200. In this embodiment, the pair of second holes 103/104 are located at the centerline C and respectively aligned with and located above a top end and below a bottom end of the rib 111. In this embodiment, in the retention section, a width, i.e., the dimension along the transverse direction, of the upper region where the second hole 103 is located, is slightly larger than that of the lower region where the second hole 104 is located. In other words, the slope of the lower region is smaller than that of the upper region for facilitating insertion of the compliant tail 100 into the positioning hole 201.

Figure 6:
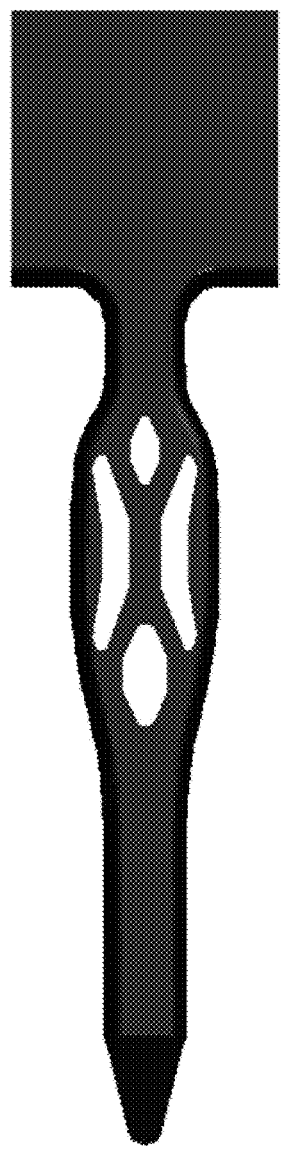
FIG. 6 is an elevational view of the electrical contact according to a second embodiment of the invention.
Figure 6A:
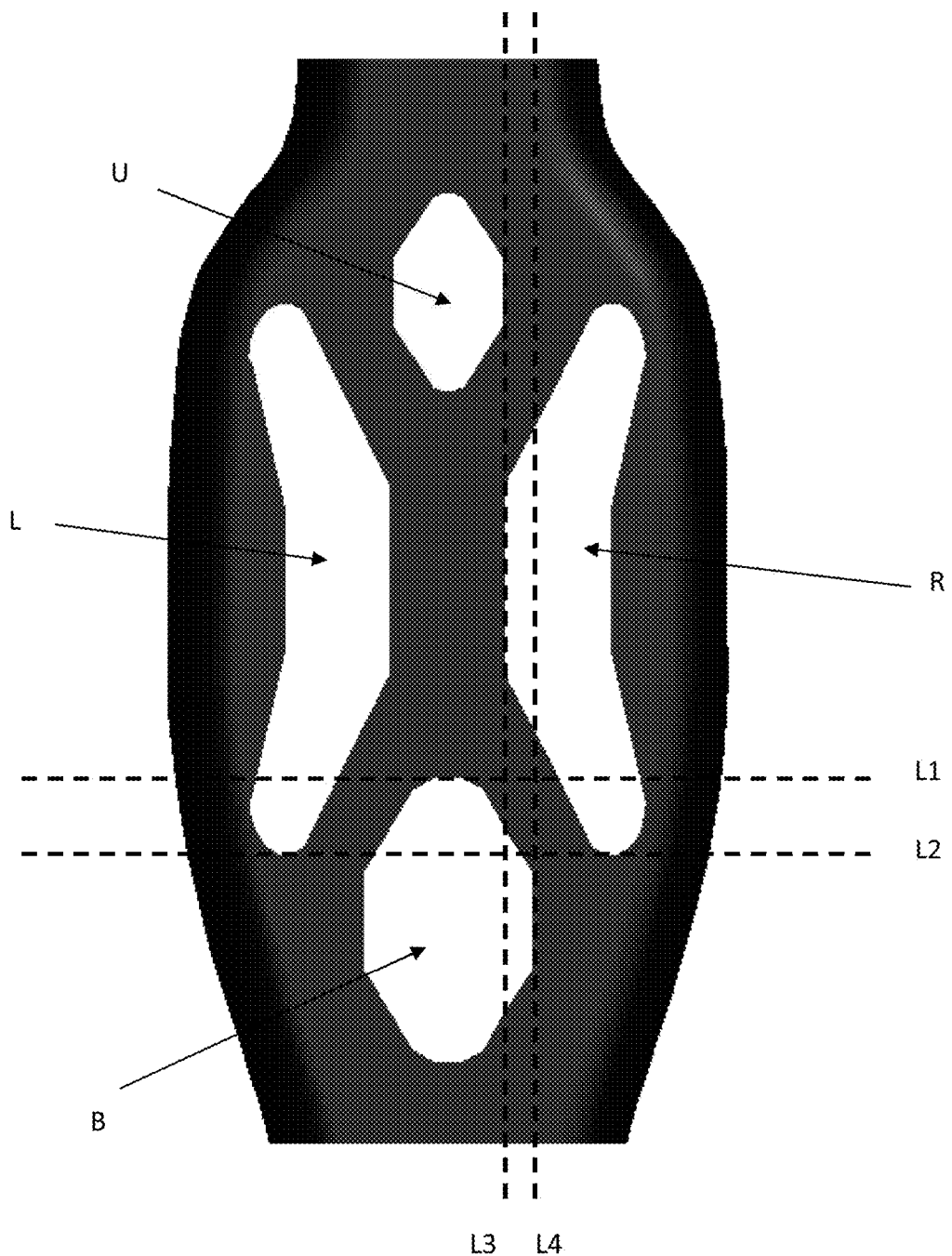
FIG. 6(A) is an enlarged elevantional view of the retention section of the contact tail of the electrical contact of FIG. 6.

Referring to FIGS. 6 and 6(A) showing the second embodiment, the pair of first (left and right) holes L/R and the pair of second (top/bottom) holes UB are arranged with an X-configuration rib formed thereamong wherein viewed along the transverse direction T, the bottom hole B and the right hole R are overlapped between line L1 and line L2; viewed along the vertical direction V, the bottom hole B and the right hole R are overlapped between line L3 and line L4. Notably, the similar relation is applied to other neighboring holes. Notably, in the first embodiment, the first holes and the second holes are not overlapped when viewed in the transverse direction. In the second embodiment, both second holes U and B are configured with a fish eye configuration, and both holes L and R are configured to be outwardly bowed away from each other.

However, the disclosure is illustrative only, changes may be made in detail, especially in matter of shape, size, and arrangement of sections within the principles of the invention.

What is claimed is:

1. An electrical contact for mounting to a through hole in a printed circuit board, comprising:
   a compliant tail stamped from sheet metal and including a pair of opposite first main face and second main face, and a pair of opposite first side face and second side face linked between the first main face and the second main face,
   a retention section formed on the compliant tail and forming a bulge area;
   a pair of first holes and a pair of second holes formed in the retention section and extending therethrough in a thickness direction of the compliant tail; wherein
   the pair of first holes are located by two sides of a centerline of the compliant tail extending along a vertical direction perpendicular to the thickness direction; wherein
   a rib formed between the pair of first holes in a transverse direction perpendicular to both the thickness direction and the vertical direction; wherein
   the pair of second holes are located at opposite top end and bottom end of the rib in the vertical direction and at the center line; wherein
   the bulge area is symmetrical relative to the centerline.

2. The electrical contact as claimed in claim 1, wherein the pair of first holes are inwardly bowed toward each other in the transverse direction.

3. The electrical contact as claimed in claim 1, wherein the pair of first holes are outwardly bowed away from each other in the transverse direction.

4. The electrical contact as claimed in claim 1, wherein viewed along the transverse direction, the pair of first holes and the pair of second holes are not overlapped with each other.

5. The electrical contact as claimed in claim 1, wherein viewed along the transverse direction, the pair of first holes and the pair of second holes are partially overlapped with each other.

6. The electrical contact as claimed in claim 1, viewed along the vertical direction, the pair of first holes and the pair of second holes are partially overlapped with each other.

7. The electrical contact as claimed in claim 1, wherein the rib forms a calabash configuration.

8. The electrical contact as claimed in claim 7, wherein the pair of first holes are inwardly bowed toward each other in the transverse direction.

9. The electrical contact as claimed in claim 1, wherein the rib forms an X like configuration.

10. The electrical contact as claimed in claim 9, wherein the pair of first holes are outwardly bowed away from each other in the transverse direction.

11. The electrical contact as claimed in claim 1, wherein in the pair of second holes, one located around the top end of the rib is smaller than the other located around the bottom end of the rib.

12. The electrical contact as claimed in claim 11, wherein a slope of a lower region of the retention section is smaller than that of an upper region thereof.

13. An electrical contact assembly comprising:
    a printed circuit board defining a through hole in a vertical direction;
    a contact made from sheet metal and including a compliant tail
    said compliant tail including a pair of opposite first main face and second main face, and a pair of opposite first side face and second side face linked between the first main face and the second main face,
    a retention section formed on the compliant tail and forming a bulge configuration and received within the through hole;
    a pair of first holes and a pair of second holes formed in the retention section and extending therethrough in a thickness direction of the compliant tail perpendicular to the vertical direction; wherein
    the pair of first holes are located by two sides of a centerline of the compliant tail extending along said vertical direction; wherein
    a rib formed between the pair of first holes in a transverse direction perpendicular to both the thickness direction and the vertical direction; wherein
    the pair of second holes are located at opposite top end and bottom end of the rib in the vertical direction and at the center line.

14. The electrical contact assembly as claimed in claim 13, wherein the pair of first holes are either bowed inwardly toward or outwardly away from each other in the transverse direction.

15. The electrical contact assembly as claimed in claim 13, wherein viewed along the transverse direction, the pair of first holes and the pair of second holes are not or partially overlapped with each other.

16. The electrical contact assembly as claimed in claim 13, viewed along the vertical direction, the pair of first holes and the pair of second holes are partially overlapped with each other.

17. The electrical contact assembly as claimed in claim 13, wherein the rib forms a calabash configuration or an X like configuration.

18. The electrical contact assembly as claimed in claim 13, wherein in the pair of second holes, one located around the top end of the rib is smaller than the other located around the bottom end of the rib.

19. The electrical contact assembly as claimed in claim 18, wherein a slope of a lower region of the retention section is smaller than that of an upper region thereof.

20. The electrical contact assembly as claimed in claim 13, wherein the pair of second holes are exposed and located outside of the through hole.

* * * * *